United States Patent
Xie et al.

(10) Patent No.: US 11,288,413 B2
(45) Date of Patent: Mar. 29, 2022

(54) METHOD FOR AUTOMATIC MODELING OF AN ARCHITECTURE BASED ON AN ARCHITECTURAL DRAWING

(71) Applicant: Guangzhou University, Guangdong (CN)

(72) Inventors: Hongyu Xie, Guangdong (CN); Changhui Li, Guangdong (CN); Junhua Zhu, Guangdong (CN); Chuanhao Tan, Guangdong (CN); Jiarui Zhang, Guangdong (CN); Enxuan Hu, Guangdong (CN); Dongning Huang, Guangdong (CN); Jingyi Guo, Guangdong (CN); Chuqi Yang, Guangdong (CN); Yang Song, Guangdong (CN); Ganguang Zhang, Guangdong (CN); Dongquan Lin, Guangdong (CN)

(73) Assignee: Guangzhou University, Guangzhou (CN)

( * ) Notice: Subject to any disclaimer, the term of this patent is extended or adjusted under 35 U.S.C. 154(b) by 558 days.

(21) Appl. No.: 16/266,004

(22) Filed: Feb. 2, 2019

(65) Prior Publication Data
US 2019/0251209 A1 Aug. 15, 2019

(30) Foreign Application Priority Data
Feb. 9, 2018 (CN) .......................... 201810141392.1

(51) Int. Cl.
*G06F 30/13* (2020.01)
*G06F 30/20* (2020.01)
*G06T 17/00* (2006.01)

(52) U.S. Cl.
CPC .............. *G06F 30/13* (2020.01); *G06F 30/20* (2020.01); *G06T 17/00* (2013.01)

(58) Field of Classification Search
CPC .......... G06F 30/13; G06F 30/00; G06F 30/20; G06T 17/00
(Continued)

(56) References Cited

U.S. PATENT DOCUMENTS

| 2018/0032643 | A1* | 2/2018 | Wright | .................... G06F 30/18 |
| 2018/0032645 | A1* | 2/2018 | Wright | .................... G06F 30/13 |

OTHER PUBLICATIONS

Li, Ting et al., "Efficient Reconstruction from Architectural Drawings", 2010, Int. J. Computer Applications in Technology, vol. 38, Nos. 1/2/3, Inderscience Enterprises Ltd. (Year: 2010).*
(Continued)

*Primary Examiner* — Cedric Johnson

(57) ABSTRACT

The present disclosure provides a method for automatic modeling of an architecture based on an architectural drawing, comprising steps of: reading parameter information of the architectural drawing, identifying a category to which any architectural object belongs by acquiring line segments constituting the architectural object and coordinate data of endpoints of the line segments; generating a binary file or a preset number of binary files based on the coordinate data and elevation data of the endpoints of all the line segments of architectural objects belonging to the same category for all storeys of the architectural drawing; optimizing the binary file or the binary files corresponding to the architectural objects belonging to the same category for all the storeys of the architectural drawing; and generating a three-dimensional model of the architecture. The modeling precision and modeling efficiency of the architecture can be improved by adopting the technical solution of the present disclosure.

9 Claims, 6 Drawing Sheets

(58) Field of Classification Search
USPC .............................................................. 703/1
See application file for complete search history.

(56) References Cited

OTHER PUBLICATIONS

Wang, Langyue et al., "An Integrated Framework for Reconstructing Full 3D Building Models", 2011, Advances in 3D Geo-Information Sciences, Springer-Verlag. (Year: 2011).*
Rui Zhai, Reading, Recognition and 3D Reconstruction of AutoCAD Architectural Drawings, Hangzhou Normal University, Apr. 2011.
Qingping Yuan, Research in 3D Reconstruction of Architectural Drawings, Nanjing University of Technology, Apr. 2005.
Lijing Liu, Research on Constructing 3D Scene Technology by Using 2D Graphic Information, Shenyang University of Technology, Dec. 10, 2007.
Chuan Liu, Study on Urban 3D-Modeling System Based on ObjectARX and Google Earth, Central South University, May 30, 2010.

* cited by examiner

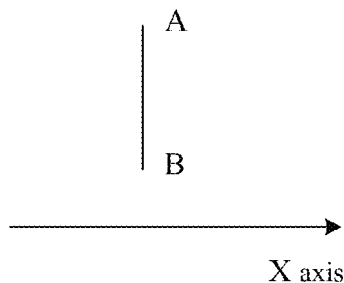
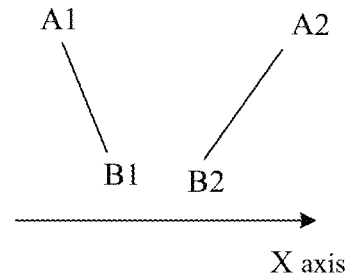
Fig. 1A
Fig. 1B
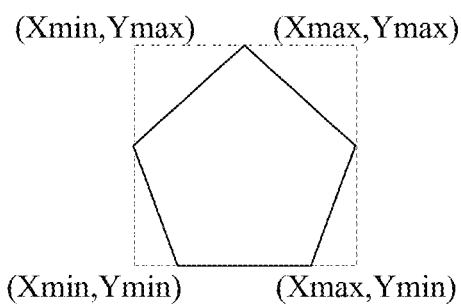
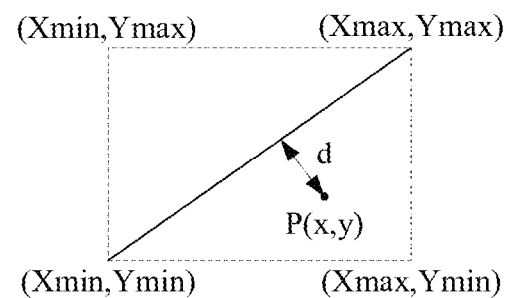
Fig. 2
Fig. 3
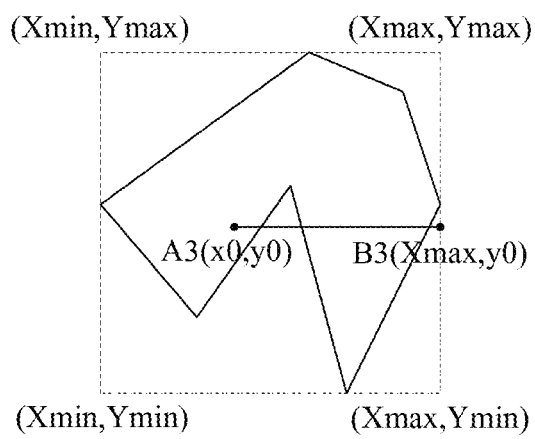
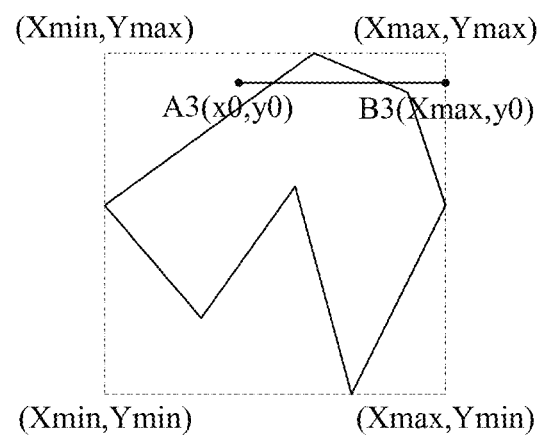
Fig. 4A
Fig. 4B

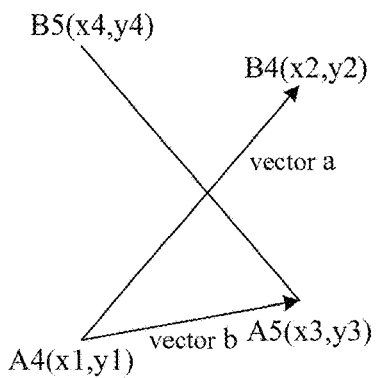 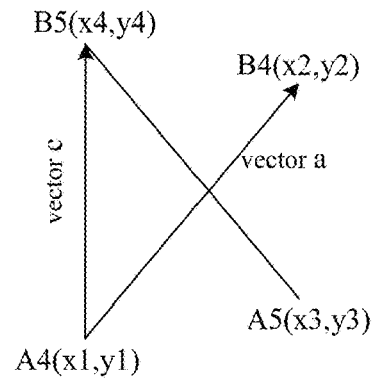
Fig. 5A　　　　　　　　　　Fig. 5B
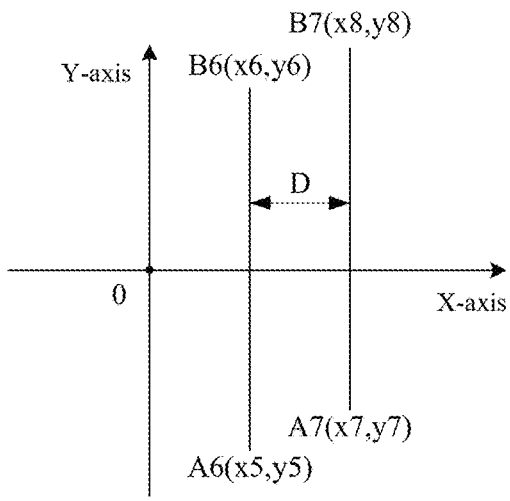 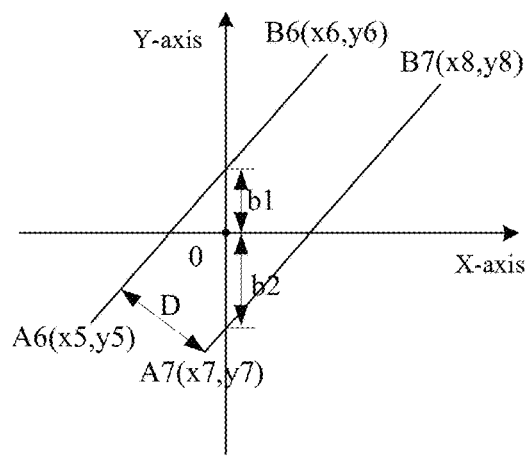
Fig. 6A　　　　　　　　　　Fig. 6B
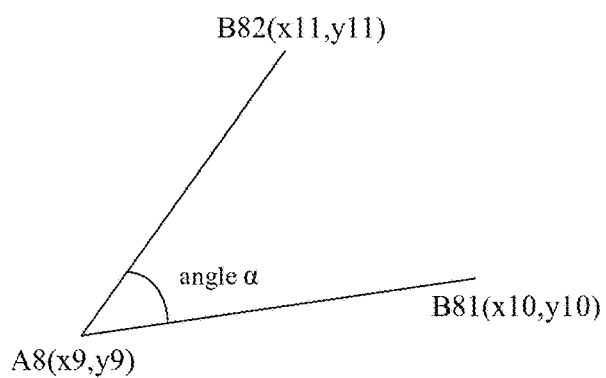
Fig. 7

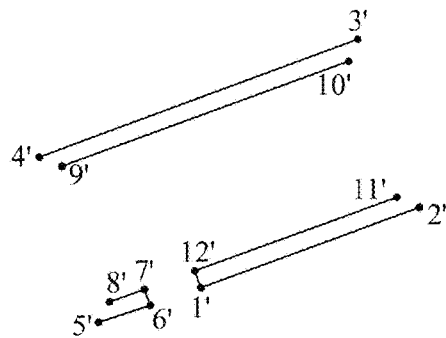
Fig. 12C
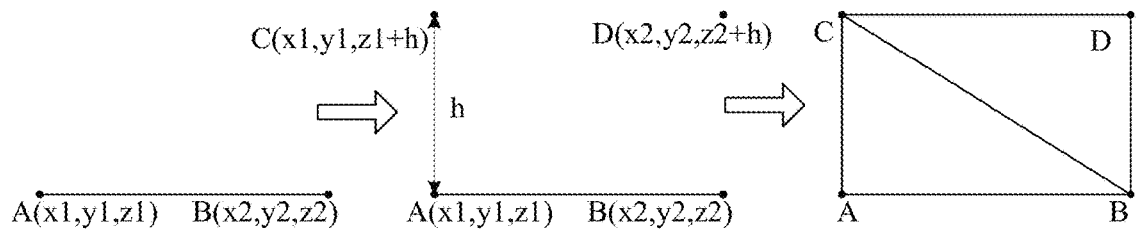
Fig. 13
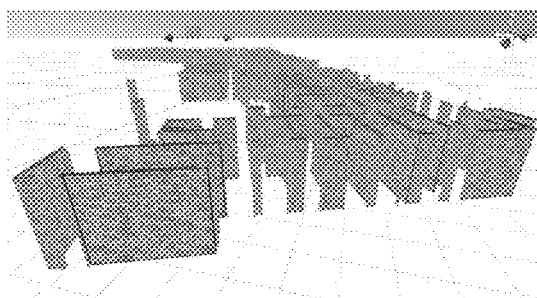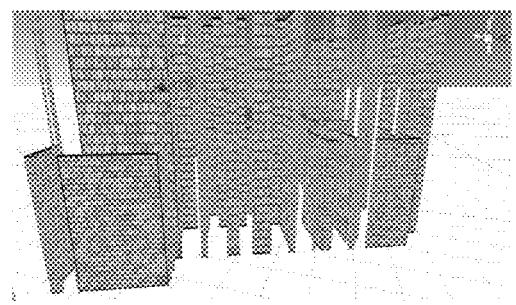
Fig. 14
Fig. 15A  Fig. 15B

METHOD FOR AUTOMATIC MODELING OF AN ARCHITECTURE BASED ON AN ARCHITECTURAL DRAWING

CROSS-REFERENCE TO RELATED APPLICATION

This application claims the priority of Chinese Patent Application No. 201810141392.1 filed on Feb. 9, 2018, the content of which is incorporated herein by reference.

FIELD OF THE INVENTION

The present invention relates to the technical field of computer three-dimensional automatic modeling, in particular to a method for automatic modeling of an architecture based on an architectural drawing.

BACKGROUND OF THE INVENTION

With the rapid development of urban construction and computer technology, designing architectures with a computer has become a common means, and the manner of designing has changed gradually from designing two-dimension architectural drawings into designing three-dimension architectural models.

Modeling solutions of the prior art are basically the same, such as in Zhai Rui's "Reading, Recognition and 3D Reconstruction of AutoCAD Architectural Drawings, Yuan Qingping's" Research in 3D Reconstruction of Architectural Drawings, Liu Chuan's "Study on Urban 3D-Modeling System Based on ObjectARX and Google Earth", and Liu Lijing's "Research on Constructing 3D Scene Technology by Using 2D Graphic Information". Generally, the modeling solutions of the prior art include the following steps: reading an architectural drawing, identifying an entity with a computer image processing algorithm, obtaining coordinate data of different architectural objects of the architecture, outputting the coordinate data to a three-dimension engine on the basis of a preset elevation, and generating a three-dimension model of the architecture.

However, the prior art doesn't make full use of the information contained in the architectural drawings during the identification process of the architectural drawings. The prior art identifies very few objects and fails to identify the details in the architectural drawings, therefore the identification accuracy of the architectural objects is low and the details of the architecture are difficult to be displayed, which leads to a poor accuracy of the three-dimensional model of the generated architecture. In addition, when the architecture is multi-storey, there are both differences and similarities between the structures of different storeys, however the prior art doesn't pre-optimize the similar parts of different storeys when models an architecture, which leads to large amounts of data to be processed and results in inefficient modeling of the architecture.

SUMMARY OF THE INVENTION

The technical problem to be solved by embodiments of the present application is to provide a method for automatic modeling of an architecture based on an architectural drawing so as to improve the modeling accuracy and modeling efficiency of the architecture.

In order to solve the problem mentioned above, the embodiments of the present invention provide a method for automatic modeling of an architecture based on an architectural drawing. The method comprises the following steps:

reading parameter information of the architectural drawing, identifying a category of an architectural object by acquiring line segments constituting the architectural object and coordinate data of endpoints of the line segments;

generating one or more binary files of the architectural objects belonging to a same category of all story of the architectural drawing based on the coordinate data and elevation data of the endpoints of all the line segments of the architectural objects;

optimizing said one or more binary files of the architectural objects belonging to the same category for all the storeys of the architectural drawing to obtain one or more optimized binary files; and generating a three-dimensional model of the architecture based on the optimized binary files.

Compared with the prior art, the embodiments of the present invention provide a method for automatic modeling of an architecture based on an architectural drawing. By reading parameter information of the architectural drawing and acquiring line segments constituting the architectural object and coordinate data of endpoints of the line segments, a category of an architectural object can be identified, therefore the modeling accuracy of the architecture is improved; by optimizing the one or more binary files corresponding to the architectural objects belonging to the same category for all the storeys of the architectural drawing, the similar parts of all the storeys can be optimized and the amount of data to be processed can be reduced, therefore the modeling efficiency of the architecture is improved.

Furthermore, the category of the architectural object of the architectural drawing comprises a column, a wall, a door, a window, a staircase, a balcony, a ventilation shaft, a floor, and a roof;

wherein identifying a category of an architectural object by acquiring line segments constituting the architectural object and coordinate data of endpoints of the line segments comprises:

setting an identifying order of priority of each kind of the category; and on the basis of the identifying order, finding out the line segments constituting the architectural object of a target kind of the category and the coordinate data of the endpoints of the line segments to identify the category of the architectural object.

Furthermore, optimizing said one or more binary files of the architectural objects belonging to the same category for all the storeys of the architectural drawing to obtain one or more optimized binary files comprises:

reading said one or more binary files of the architectural objects belonging to the same category for all the storeys of the architectural drawing to obtain the coordinate data and the elevation data of the endpoints of all the line segments of the architectural objects;

obtaining all the line segments constituting the architectural objects based on the obtained coordinate data and the elevation data of the endpoints of the line segments; and optimizing all the line segments constituting the architectural objects based on a traversing order from a reference storey to a highest storey.

Furthermore, the step of optimizing all the line segments constituting the architectural objects based on the traversing order from the reference storey to the highest storey comprises:

traversing in sequence from the reference storey to the highest storey, determining whether a current storey is the highest storey when traversing to the current storey; wherein the reference storey comprises a lowest storey;

determining whether there exists a line segment of the current storey overlapped with a line segment of the reference storey when the current storey is not the highest storey;

optimizing the line segment of the current storey and the line segment of the reference storey when there exists the line segment of the current storey overlapped with the line segment of the reference storey;

ceasing the traversing when no any line segment of the current storey overlaps with a line segment of the reference storey; and ceasing the traversing when the current storey is the highest storey.

Furthermore, optimizing the line segment of the current storey and the line segment of the reference storey comprises:

updating the elevation data of the endpoints of the line segment of the reference storey based on the elevation data of the endpoints of the line segment of the current storey; and deleting the line segment of the current storey.

Furthermore, updating the elevation data of the endpoints of the line segment of the reference storey based on the elevation data of the endpoints of the line segment of the current storey comprises:

replacing the elevation data of the endpoints of the line segment of the reference storey with the elevation data of the endpoints of the line segment of the current storey.

Furthermore, the step of generating a three-dimensional model of the architecture based on the optimized binary files comprises:

generating three-dimensional models of the architectural objects belonging to the same category based on the one or more optimized binary files; and generating a three-dimensional model of the architecture based on three-dimensional models of all architectural objects of the architecture.

Furthermore, the architectural objects belonging to the same category are walls, then generating three-dimensional models for the architectural objects belonging to the same category based on the one or more optimized binary files comprises:

reading the one or more optimized binary files to obtain the coordinate data and the corresponding elevation data of all the endpoints in the one or more optimized binary files;

acquiring a pair of endpoints of a line segment, generating a wall based on the pair of endpoints of the line segment and the corresponding coordinate data and the corresponding elevation data of the pair of endpoints; and generating all walls corresponding the one or more optimized binary files.

Furthermore, generating a wall based on the pair of endpoints of the line segment and the corresponding coordinate data and the corresponding elevation data of the pair of endpoints comprises:

generating two new endpoints based on the coordinate data and the elevation data of the pair of endpoints of the line segment;

generating two triangles based on the pair of endpoints of the line segment and the two new endpoints; and obtaining the wall by seamlessly splicing the two triangles.

Embodiments of the present disclosure further provide an apparatus for automatic modeling of an architecture based on an architectural drawing, the apparatus comprising a processor, wherein the processor is configured to execute the following program modules:

an identifying module, configured to read parameter information of the architectural drawing, identifying a category of an architectural object by acquiring line segments constituting the architectural object and coordinate data of endpoints of the line segments;

a binary file generation module, configured to generate one or more binary files of the architectural objects belonging to a same category of all story of the architectural drawing based on the coordinate data and elevation data of the endpoints of all the line segments of the architectural objects;

an optimization module, configured to optimize said one or more binary files of the architectural objects belonging to the same category for all the storeys of the architectural drawing to obtain one or more optimized binary files; and a modeling module, configured to generate a three-dimensional model of the architecture based on the optimized binary files.

Embodiments of the present disclosure further provide an apparatus for automatic modeling of an architecture based on an architectural drawing, wherein the apparatus comprises a processor, a memory, and a computer program stored in the memory and configured to be executed by the processor, the processor executing the computer program to implement the method of for automatic modeling of an architecture based on an architectural drawing mentioned above.

Embodiments of the present disclosure further provide a computer readable storage medium, wherein the computer readable storage medium comprises a stored computer program, a device in which the computer readable storage medium is located is controlled to execute the method of for automatic modeling of an architecture based on an architectural drawing mentioned above when the computer program is running.

BRIEF DESCRIPTION OF THE DRAWINGS

FIG. 1A is a schematic diagram illustrating the definition of a starting point and an ending point of a line segment according to a method for automatic modeling of an architecture based on an architectural drawing provided by an embodiment of the present invention;

FIG. 1B is a schematic diagram illustrating the definition of a starting point and an ending point of a line segment according to a method for automatic modeling of an architecture based on an architectural drawing provided by an embodiment of the present invention;

FIG. 2 is a schematic diagram illustrating the definition of an Envelope object according to a method for automatic modeling of an architecture based on an architectural drawing provided by an embodiment of the present invention;

FIG. 3 is a schematic diagram illustrating whether a point is on a line segment according to a method for automatic modeling of an architecture based on an architectural drawing provided by an embodiment of the present invention;

FIG. 4A is a schematic diagram illustrating whether a point is inside a polygon according to a method for automatic modeling of an architecture based on an architectural drawing provided by an embodiment of the present invention;

FIG. 4B is a schematic diagram illustrating whether a point is inside a polygon according to a method for automatic modeling of an architecture based on an architectural drawing provided by an embodiment of the present invention;

FIG. 5A is a schematic diagram illustrating the intersection of line segments according to a method for automatic modeling of an architecture based on an architectural drawing provided by an embodiment of the present invention;

FIG. 5B is a schematic diagram illustrating the intersection of line segments according to a method for automatic modeling of an architecture based on an architectural drawing provided by an embodiment of the present invention;

FIG. 6A is a schematic diagram illustrating the collinearity of line segments according to a method for automatic modeling of an architecture based on an architectural drawing provided by an embodiment of the present invention;

FIG. 6B is a schematic diagram illustrating the collinearity of line segments according to a method for automatic modeling of an architecture based on an architectural drawing provided by an embodiment of the present invention;

FIG. 7 is a schematic diagram illustrating the angle formed by line segments with a common endpoint according to a method for automatic modeling of an architecture based on an architectural drawing provided by an embodiment of the present invention;

FIG. 12C is a schematic diagrams of step S1303 according to a method for automatic modeling of an architecture based on an architectural drawing provided by a preferred embodiment of the present invention;

FIG. 13 is a specific flowchart of step S14 according to a method for automatic modeling of an architecture based on an architectural drawing provided by a preferred embodiment of the present invention;

FIG. 14 is a schematic diagram illustrating one wall generated based on two endpoints belonging to the same line segment according to a method for automatic modeling of an architecture based on an architectural drawing provided by the present invention FIG. 15A is a diagram illustrating a three-dimensional model rendering of a wall according to a method for automatic modeling of an architecture based on an architectural drawing provided by the present invention;

FIG. 15B is a diagram illustrating a three-dimensional model rendering of a wall according to a method for automatic modeling of an architecture based on an architectural drawing provided by the present invention;

DETAILED DESCRIPTION OF ILLUSTRATED EMBODIMENTS

Figure 8:
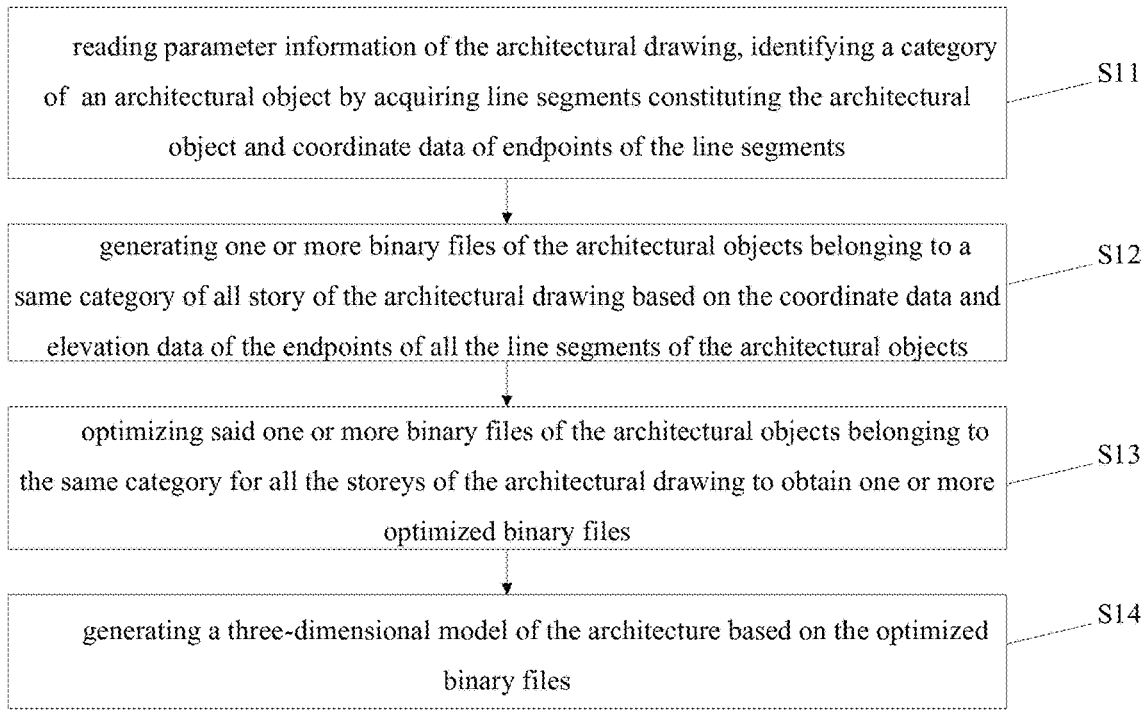
FIG. 8 is a flowchart of a method for automatic modeling of an architecture based on an architectural drawing provided by a preferred embodiment of the present invention.

Hereinafter, with reference to the accompanying drawings, the technical solutions in the embodiments of the present invention are described clearly and completely. It is obvious that the described embodiments are only a part of embodiments of the present invention, not all embodiments. All embodiments obtained based on the embodiments of the present invention by one skilled in the art without creative efforts are within the protection scope of the present invention.

In order to describe the embodiments of present application clearly, the standards and technical terms used in the embodiments of present application are defined and explained first.

1. Drawing Standard

The drawing method of each architectural object in an architectural drawing has certain standards. An automatic roof identification technology based on architectural drawings has been developed based on these standards. The national architectural drawing standard adopted by the embodiments of the present invention is the "Unified Standard for Architectural Drawing" (GB50104)-2010).

2. Starting Point and Ending Point of Line Segment

Referring to FIG. 1A-1B which are schematic diagrams illustrating the definitions of a starting point and an ending point of a line segment according to the method for automatic modeling of an architecture based on an architectural drawing provided by an embodiment of the present invention, there are two kinds of line segments: a line segment perpendicular to the X axis and a line segment not perpendicular to the X axis.

As shown in FIG. 1A, the line segment AB is perpendicular to the X axis. The endpoints of the line segment AB are A and B. The horizontal coordinates of the endpoint A and the endpoint B are the same. By comparing the vertical coordinates of the endpoint A and the endpoint B, the endpoint with the smaller vertical coordinate is set as the starting point of the line segment and the endpoint with the larger vertical coordinate is set as the ending point of the line segment, that is, the endpoint B is the starting point and the endpoint A is the ending point.

As shown in FIG. 1B, the line segment A1B1 and the line segment A2B2 are not perpendicular to the X axis. The endpoints of the line segment A1B1 and the line segment A2B2 are A1 and B1, A2 and B2 respectively. By comparing the horizontal coordinates of the endpoints A1 and B1 and the horizontal coordinates of the endpoints A2 and B2, the endpoints with the smaller horizontal coordinate are set as the starting points of the line segments and the endpoints with the larger horizontal coordinate are set as the ending points of the line segments, that is, in the line segment A1B1, the endpoint A1 is the starting point and the endpoint B1 is the ending point. In the line segment A2B2, the endpoint B2 is the starting point and the endpoint A2 is the ending point.

3. Envelope Object

Referring to FIG. 2, which is a schematic diagram illustrating the definition of an Envelope object according to a method for automatic modeling of an architecture based on an architectural drawing provided by an embodiment of the present invention. In the embodiments of the present invention, each spatial element corresponds to an Envelope object which defines a spatial extent of the spatial element. The spatial extent is the minimum enclosing rectangle of the element and is represented by four points (Xmin, Ymin), (Xmin, Ymax), (Xmax, Ymax) and (Xmax, Ymin).

4. Determination of Whether a Point is on a Line Segment

According to mathematical principles, if a line represented by the equation A*x+B*y+C=0 and the coordinate of a point P which is (x, y) are given, the distance from the point P to the line is $$d = \frac{|A*x + B*y + C|}{\sqrt{A^2 + B^2}}.$$

The relationship between the point and the line segment is determined based on the above.

Referring to FIG. 3, which is a schematic diagram illustrating whether a point is on a line segment according to a method for automatic modeling of an architecture based on an architectural drawing provided by an embodiment of the present invention. Firstly, determine whether the point P(x, y) is within the Envelope object of the line segment. If point P(x, y) is within the Envelope object of the line segment, the distance d from the point P(x, y) to the line segment can be calculated according to the formula. If the calculated distance d is less than the threshold of 0.005 m, the point P(x, y) is considered to be on the line segment.

5. Determination of Whether a Point is Inside a Polygon

Draw a ray from the target point, and if the number of intersections between the ray and all the edges of the polygon is odd, the target point is inside the polygon; and if the number is even, the target point is outside the polygon.

Referring to FIGS. 4A to 4B which are schematic diagrams illustrating whether a point is inside a polygon according to a method for automatic modeling of an architecture based on an architectural drawing provided by an embodiment of the present invention. Suppose A3 (x0, y0) is the target point, calculate the Envelope object of the polygon, draw a ray from the target point A3 (x0, y0) which intersects with the Envelope object of the polygon at point B3 (Xmax, y0), and then determine the number of intersections between the line segment A3B3 and all the edges of the polygon, if the number is odd, the target point A3 (x0, y0) is inside the polygon, as shown in FIG. 4A; and if the number is even, the target point A3 (x0, y0) is outside the polygon, as shown in FIG. 4B.

6. Intersection of Line Segments

If two line segments intersect, either the two line segments cross each other or one endpoint of one line segment is on the other line segment.

Referring to FIGS. 5A to 5B, which are schematic diagrams illustrating the intersection of line segments according to a method for automatic modeling of an architecture based on an architectural drawing provided by an embodiment of the present invention. The endpoints of the line segment A4B4 are A4 (x1, y1) and B4 (x2, y2), the endpoints of the line segment A5B5 are A5 (x3, y3) and B5 (x4, y4).

As shown in FIG. 5A, the vector a is defined as (x2−x1, y2−y1), the vector b is defined as (x3−x1, y3−y1). Based on the above, calculate the cross product of the vector a and the vector b, which is a*b=(x2−x1)*(y3−y1)−(x3−x1)*(y2−y1). If a*b>0, the vector a is in the clockwise direction of the vector b; if a*b<0, the vector a is in the counterclockwise direction of vector b; if a*b=0, the vector a is collinear with the vector b.

Similarly, as shown in FIG. 5B, the vector a is defined as (x2−x1, y2−y1), the vector c is defined as (x4−x1, y4−y1). Based on the above, calculate the cross product a*c of the vector a and the vector c. If a*c>0, the vector a is in the clockwise direction of the vector c; if a*c<0, the vector a is in the counterclockwise direction of the vector c; if a*c=0, the vector a is collinear with the vector c.

Calculate the product of the cross product of vector a and vector b and the cross product of vector a and vector c, which is (a*b)*(a*c), If (a*b)*(a*c)>0, the vector b and the vector c are both at the same side of the vector a, that is, the two endpoints of the line segment A5B5 are at the same side of the line segment A4B4;

If (a*b)*(a*c)<0, the vector b and the vector c are at different sides of the vector a, that is, the two endpoints of the line segment A5B5 are at different sides of the line segment A4B4;

If (a*b)*(a*c)=0, at least one of the vector b and the vector c is in the same direction as the vector a, that is, at least one of the two endpoints of the line segment A5B5 is on the line that the line segment A4B4 is on, then it is necessary to further determine whether there is any endpoint of the line segment A5B5 being on the line segment A4B4.

Similarly, determine whether the two endpoints of the line segment A4B4 are at different sides of the line segment A5B5.

If the two endpoints of one line segment are at different sides of the other line segment, the two line segments cross each other, and the two line segments are considered to intersect.

If an endpoint of one line segments is on the other line segment, the two segments are considered to intersect.

Otherwise, the two line segments are considered not to intersect.

7. Collinearity of Line Segments

Collinearity means that two line segments are on the same line or the distance between two parallel line segments is within a certain threshold.

Referring to FIGS. 6A to 6B, which are schematic diagrams illustrating the collinearity of line segments according to a method for automatic modeling of an architecture based on an architectural drawing provided by an embodiment of the present invention. The endpoints of the line segment A6B6 are A6 (x5, y5) and B6 (x6, y6), the endpoints of the line segment A7B7 are A7 (x7, y7) and B7 (x8, y8), the absolute value of the difference of the horizontal coordinates between the endpoints A6 (x5, y5) and B6 (x6, y6) is d1=|x5−x6|, the absolute value of the difference of the horizontal coordinates between the endpoints A7 (x7, y7) and B7 (x8, y8) is d2=|x7−x8|.

If d1 and d2 are both less than or equal to the threshold of 0.0001 m, the two line segments are both considered perpendicular to the X-axis, as shown in FIG. 6A, and the distance between the two line segments is D=|x5−x7|.

If d1 and d2 are both greater than the threshold of 0.0001 m, the two line segments are both considered not perpendicular to the X axis, as shown in FIG. 6B. The slopes of the two line segments are calculated as $$k1 = \frac{y6 - y5}{x6 - x5} \text{ and } k2 = \frac{y8 - y7}{x8 - x7}$$

respectively, and the intercepts of the two line segments are b1=y5−k1*x5 and b2=y7−k2*x7 respectively, the distance between the two line segments is the distance between an endpoint of the line segment A7B7 and the line segment A6B6, that is $$d = \frac{|y7 - k1 * x7 - b1|}{\sqrt{1 + (-k1)^2}}.$$

If the distance D obtained above is less than the threshold of 0.01 m and one line segment has a point on the other line segment, the two line segments are considered to be collinear.

8. Angle of Line Segments with Common Endpoint

Referring to FIG. 7, which is a schematic diagram illustrating the angle formed by line segments with a common endpoint according to a method for automatic modeling of an architecture based on an architectural drawing provided by an embodiment of the present invention. The endpoints of the two line segments are respectively A8 (x9, y9) and B81 (x10, y10), A8 (x9, y9) and B82 (x11, y11). The common endpoint that the two line segments have is A8 (x9, y9). The angle between the two segments is:

$$\alpha = \cos^{-1} \frac{(x10 - x9)*(x11 - x9) + (y10 - y9)*(y11 - y9)}{\sqrt{(x10 - x9)^2 * (y10 - y9)^2} * \sqrt{(x11 - x9)^2 * (y11 - y9)^2}}.$$

9. Entity

An entity is a graphic used to represent an architectural object in an architectural drawing.

10. Attribute Information

For a line segment, the attribute information mainly comprises a starting point, an ending point and a number of points; for an arc, the attribute information mainly comprises an arc center, a radius, a starting point and an ending point; for a circle, the attribute information mainly comprises a center and a radius.

With the standards and technical terms defined and explained above, the technical solutions of the embodiments of present application are specifically described below.

Referring to FIG. 8, which is a flowchart of a method for automatic modeling of an architecture based on an architectural drawing provided by a preferred embodiment of the present invention, the method comprises steps S11 to S14:

Step S11, reading parameter information of the architectural drawing, identifying a category of an architectural object by acquiring line segments constituting the architectural object and coordinate data of endpoints of the line segments;

In step 11, since the architectural object belonging to the same category are drew on the same layer of the architectural drawing, the line segments constituting the architectural object and the coordinate data of the endpoints of the line segments are acquired by respectively reading the information of each layer. That is, the information of all the architectural objects of each storey of the architecture with respect to the corresponding layer are read respectively, and line segments constituting each architectural object and coordinate data of endpoints of the line segments are respectively identified in a preset order, of which the specific implementation process will be described below;

Step S12, generating one or more binary files of the architectural objects belonging to a same category of all story of the architectural drawing based on the coordinate data and elevation data of the endpoints of all the line segments of the architectural objects;

In step S12, the one or more binary files store the elevation data of each endpoint directly, or alternatively stores the height data of each endpoint. The height data is the distance of each endpoint relative to the floor of the corresponding storey. It should be noted that the floor of the corresponding storey is not necessarily the floor of the storey where the endpoints are located.

Step S13, optimizing said one or more binary files of the architectural objects belonging to the same category for all the storeys of the architectural drawing to obtain one or more optimized binary files; and Step S14, generating a three-dimensional model of the architecture based on the optimized binary files.

Specifically, the information of all the architectural objects of each storey of the building with respect to the corresponding layer mentioned above comprises the attribute information of all the graphics primitives with respect to the corresponding layers and the coordinate data of the endpoints of all the graphics primitives, that is, the attribute information of the graphics that constitutes the graphics primitives and the coordinate data of the endpoint of the graphics. Wherein, a graphics primitive represents an architectural object. The shape of the architectural object can be determined based on the attribute information of the graphics primitive. The line segments constituting the architectural objects corresponding to the graphics primitive and the coordinate data of the endpoints of the line segments can be identified based on the attribute information of the graphics primitive and the coordinate data of the endpoints of the graphics primitive.

It should be noted that the coordinate data of an endpoint are three-dimensional coordinates used to indicate the spatial position of the endpoint.

Specifically, the elevation data of the endpoints in step S12 refers to the height of the endpoints with respect to the entire architecture, that is, the absolute height.

Specifically, each binary file in step S12 corresponds to architectural objects belonging to the same category for all the storeys, or each binary file corresponds to architectural objects belonging to the same category for one storey, or each binary file corresponds to architectural objects belonging to the same category for several storeys. The one or more binary files include the coordinate data of the endpoints of all the line segments constituting the architectural objects and the elevation data or height data of the corresponding endpoint, which has been described above.

Figure 9:
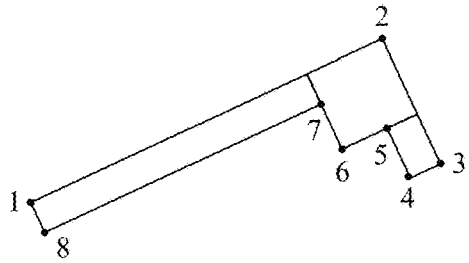
FIG. 9 is a schematic diagram illustrating an identified wall column entity according to a method for automatic modeling provided by an architecture based on a architectural drawing of the present invention.

It should be noted that after the identification of various architectural objects is completed, parameter of each architectural object need to be stored based on the line segments, that is, the coordinate data of the endpoints of the line segments and the elevation data of the endpoints to the corresponding binary file are output for storage. Now take a binary file corresponding to identified graphics primitives of wall columns as an example. As shown in FIG. 9, which is a schematic diagram illustrating an identified graphics primitive of a wall column according to a method for automatic modeling of an architecture based on an architectural drawing of the present invention, the identified line segments in the figure are the line segment 12, the line segment 23, the line segment 34, the line segment 45, the line segment 56, the line segment 67, the line segment 78, and the line segment 81 respectively, and the data structure of the binary file corresponding to the wall column entity is as shown in Table 1, and the storage fields include NameID (the point with the same nameID is on the same line segment), order (the order of recording points), X coordinate, Y coordinate, Z coordinate, and height H. It should be noted that the Z coordinate herein refers to the plane coordinate values of the endpoints, that is, the elevation data of the floor of the corresponding storey (which is not necessarily the storey where the endpoint is located), and H refers to the height of the endpoint relative to the floor of the corresponding storey. In another preferred embodiment, the binary file can also directly store the elevation data of the endpoints.

ing a three-storey architecture as an example, there is supposed to be architectural objects belonging to the category of window for different storeys, so all the windows are identified storey by storey, so that a binary file corresponding to the windows of the first storey, a binary file corresponding to the windows of the second storey, and a binary file corresponding to the windows of the third storey are generated, and then the above three binary files are optimized. In another preferred embodiment, a binary file is generated directly for architectural objects belong to the same category for all storeys. Taking a three-storey architecture as an example, a binary file which stores all of the windows of the first storey, the windows of the second storey and the windows of the third storey is generated.

It should be noted that in order to ensure the architectural drawings of different storeys can be matched on the plane coordinate, one of the storeys can be selected as a reference storey, of which several reference points are selected according to actual demand. And then corresponding positions of other storeys are selected as matched points. The horizontal coordinates of the points at the same position of each storey are enabled to be matching by a transformational algorithm such as translating and scaling.

In another preferred embodiment, the category of the architectural object of the architectural drawing comprises a

TABLE 1

Data structure of the binary file corresponding to graphics primitive of wall column in FIG. 9

| Name of point | NameID (integer) | Order (integer) | X (double precision floating point number) | Y (double precision floating point number) | Z (double precision floating point number) | H (double precision floating point number) |
| --- | --- | --- | --- | --- | --- | --- |
| Point 1 | 1 | 1 | 58933.6790 | 34232.6040 | 32 | 5.2 |
| Point 2 | 1 | 2 | 58939.6537 | 34235.0995 | 32 | 5.2 |
| Point 2 | 2 | 1 | 58939.6537 | 34235.0995 | 32 | 5.2 |
| Point 3 | 2 | 2 | 58940.0391 | 34234.1768 | 32 | 5.2 |
| Point 3 | 3 | 1 | 58940.0391 | 34234.1768 | 32 | 5.2 |
| Point 4 | 3 | 2 | 58939.8546 | 34234.0997 | 32 | 5.2 |
| Point 4 | 4 | 1 | 58939.8546 | 34234.0997 | 32 | 5.2 |
| Point 5 | 4 | 2 | 58939.7004 | 34234.4688 | 32 | 5.2 |
| Point 5 | 5 | 1 | 58939.7004 | 34234.4688 | 32 | 5.2 |
| Point 6 | 5 | 2 | 58939.3313 | 34234.3146 | 32 | 5.2 |
| Point 6 | 6 | 1 | 58939.3313 | 34234.3146 | 32 | 5.2 |
| Point 7 | 6 | 2 | 58939.1772 | 34234.6837 | 32 | 5.2 |
| Point 7 | 7 | 1 | 58939.1772 | 34234.6837 | 32 | 5.2 |
| Point 8 | 7 | 2 | 58933.7560 | 34232.4195 | 32 | 5.2 |
| Point 8 | 8 | 1 | 58933.7560 | 34232.4195 | 32 | 5.2 |
| Point 1 | 8 | 2 | 58933.6790 | 34232.6040 | 32 | 5.2 |

Specifically, for the architectural objects of each storeys, architectural objects belonging to different categories correspond to different binary files respectively, but the architectural objects of different storeys might belong to the same category, so step S13 optimizes the one or more binary files corresponding to architectural objects belonging to the same category for all the storeys.

It should be understood that for multi-storey architecture, category, number, size and shape of the architectural objects between different storeys may not be identical. To reflect the differences between different storeys, separate architectural drawings are used for storeys that differ from each other. Therefore, it is necessary to identify the multi-storey architecture storey by storey. Alternatively, the steps S11 is performed for each storey of the architecture so as to identify all the architectural objects of all the storeys; the related data of architectural objects belonging to the same category for different storeys are stored separately so as to generate a corresponding binary file for each storey respectively. Takcolumn, a wall, a door, a window, a staircase, a balcony, a ventilation shaft, a floor, and a roof; also, the category of a patio, an elevator shaft or a conduit shaft is within the protective scope of the present invention.

then identifying the category of the architectural object by acquiring the line segments constituting the architectural object and the coordinate data of the endpoints of the line segments comprises:

setting an identifying order of priority of each kind of the category, and on the basis of the identifying order, finding out the line segments constituting the architectural object of a target kind of the category and the coordinate data of the endpoints of the line segments to identify the category of the architectural object.

It should be noted that, in the embodiment, the preset order specifically refers to identifying the columns firstly, and identifying the walls after completing the identification of the columns, identifying the doors and the windows after completing the identification of the walls, identifying the staircases and the balconies after completing the identification of the columns, the walls, the doors and the windows, identifying the ventilation shafts after completing the identification of the columns, the walls, the doors, the windows and the roofs, identifying the floors after completing the identification of the columns, the walls, the doors, the windows, the balconies and the ventilation shafts.

Wherein, the identification of the category of architectural objects comprises acquiring the line segments constituting the architectural objects and the coordinate data of the endpoints of the line segments based on the information of the architectural objects with respect to the corresponding layer. Specifically, for the identification of the architectural objects of the category of column, it is necessary to acquire the column lines constituting the column and the coordinate data of the endpoints of the column lines; for the identification of the architectural objects belonging to the category of wall, it is necessary to determine whether the closed polygon wall lines are connected with the columns based on the identified columns, and if not connected, find out the line segments constituting an independent closed polygon wall lines and the coordinate data of the endpoints of the line segments, if connected, take the connected closed polygon wall lines and the columns as a whole to identify, and acquire the line segments of the wall-column graphics primitives formed by the connection of the closed polygonal wall lines and the columns and finding out the coordinate data of the endpoints of the line segments; for the identification of the architectural objects belonging to the category of door, it is necessary to find out the door lines constituting the doors and the coordinate data of the endpoints of the door lines, and find out the line segments of the door walls constituting the doors and the coordinate data of the endpoints of the line segments; for the identification of the architectural objects belonging to the category of window, it is necessary to find out the window lines constituting the windows and the coordinate data of the endpoints of the window lines, and find out the line segments of the window walls constituting the windows and the coordinate data of the endpoints of the line segments; for the identification of the architectural objects belonging to the category of staircase, it is necessary to find out the line segments constituting the staircases, the stair ventilation shafts and the platforms of the staircases respectively and the coordinate data of the endpoints of the corresponding line segments; for the identification of the architectural objects belonging to the category of balcony, it is necessary to find out the coordinate data of the endpoints of the outer balcony panels constituting the outer balconies and the inner balcony panels constituting the inner balconies; for the identification of the architectural objects belonging to the category of roof, it is necessary to find out the line segments constituting the outlines of the roofs and the coordinate data of the endpoints of the line segments; for the identification of the architectural objects of ventilation shaft, it is necessary to find out the line segments constituting the outlines of the ventilation shafts and the coordinate data of the endpoints of the line segments; for the identification of the architectural objects of floor, it is necessary to find out the line segments constituting the outlines of the floors and the coordinate data of the endpoints of the line segments.

In another preferred embodiment, before generating the binary file or the binary files, it is necessary to determine the elevation data of the endpoints of each line segment firstly, which comprises:

determining elevation data of the endpoints of each line segment based on the corresponding elevation data of the floor of the corresponding storey.

Specifically, since an architectural drawing can only represent the structure of one storey or several identical storeys of the architecture, in the process of identifying line segments constituting the architectural objects based on an architectural drawing, the obtained coordinate data of the endpoints of the line segments are based on the data of the storey represented by the architectural drawing. Therefore, the elevation data of endpoints of each line segments need to be determined according to the elevation data of the floor of the corresponding storey represented by the architectural drawing. The coordinates Z of the endpoints as shown in Table 1 are the elevations of the floors of the storeys to which the endpoints correspond, and the H are the heights of the endpoints relative to the floors of the corresponding storeys, the data calculated by Z+H are the elevation of the endpoints. It should be noted that the floors of the corresponding storeys are not necessarily the floor of the storey where the endpoints are located. For example, when the respective structures of the second storey to the fourth storey are the same, the three storeys generate one architectural drawing, and the plane coordinates Z of each endpoint located in the second storey to the fourth storey correspond to the elevation data of the floor of the second storey.

It should be noted that the heights of the walls and columns can be obtained based on the elevation drawings of the architecture, and the heights of the doors, windows, balcony railings and balcony connecting walls, etc. can be defined by the user; based on the heights of the walls, columns, doors and windows, it can be determined that the heights of the lower sides of the door-walls are the heights of the doors, and the heights of the upper sides of the door-walls are the difference between the heights of the walls where the door are located and the heights of the doors, the heights of the lower window-walls are the heights of the windowsills, the heights of the lower sides of the upper window-walls are the sum of the heights of the windows and the heights of the windowsills, the heights of the upper sides of the upper window-walls are the difference between the heights of the walls where the windows are located and the heights of the lower side of the upper window-walls.

Figure 10:
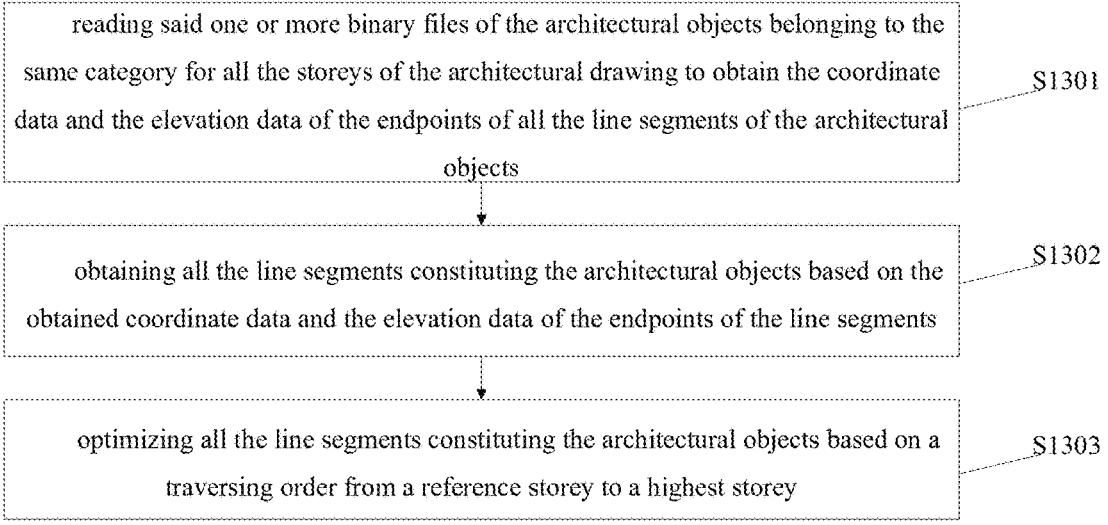
FIG. 10 is a specific flowchart of step S13 according to a method for automatic modeling of an architecture based on an architectural drawing provided by a preferred embodiment of the present invention.

Referring to FIG. 10, which is a specific flowchart of step S13 according to a method for automatic modeling of an architecture based on an architectural drawing of a preferred embodiment provided by the present invention, the step of optimizing the one or more binary files of the architectural objects belonging to the same category for all the storeys of the architectural drawing comprises steps S1301 to S1303:

Step S1301, reading said one or more binary files of the architectural objects belonging to the same category for all the storeys of the architectural drawing to obtain the coordinate data and the elevation data of the endpoints of all the line segments of the architectural objects;

Step S1302, obtaining all the line segments constituting the architectural objects based on the obtained coordinate data and the elevation data of the endpoints of the line segments; and Step S1303, optimizing all the line segments constituting the architectural objects based on a traversing order from a reference storey to a highest storey.

It should be understood that after completing the identifications of all the architectural objects, the coordinate data of the corresponding endpoints and the elevation data (or height data) of the endpoints are stored in the obtained binary files. The three-dimensional modeling is realized based on the line segments formed by the corresponding endpoints in these binary files. The more line segments there are, the greater the amount of data that need to be processed in modeling. Since there may be the same category of architectural objects of different storeys and there may be structurally identical parts of architectural objects belonging to the same category, the method provided by the embodiment optimizes the line segments with the same features for all the line segments constituting the architectural objects belonging to the same category for all storeys, thereby reducing the amount of data that need to be processed in modeling.

Figure 11:
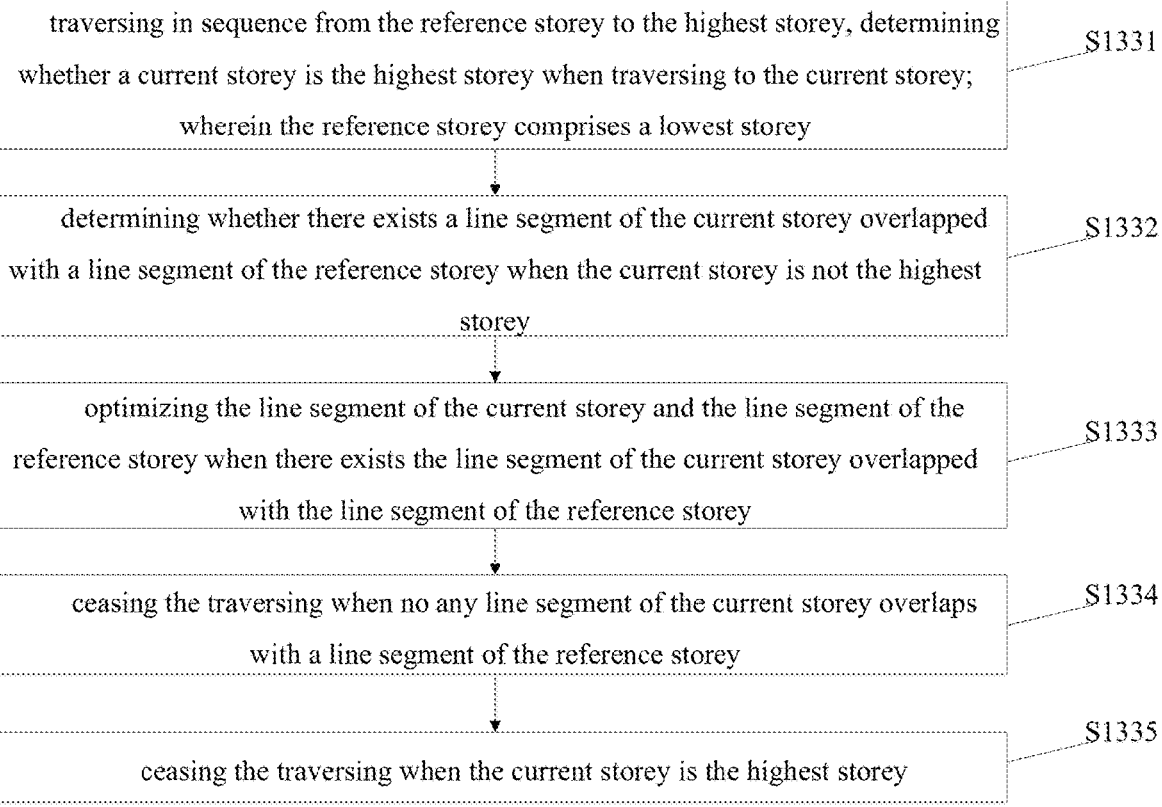
FIG. 11 is a specific flowchart of step S1303 according to a method for automatic modeling of an architecture based on an architectural drawing provided by a preferred embodiment of the present invention.

Referring to FIG. 11, which is a specific flowchart of step S1303 according to a method for automatic modeling of an architecture based on an architectural drawing provided by a preferred embodiment of the present invention. The step of optimizing all the line segments constituting the architectural objects based on the traversing order from the reference storey to the highest storey comprises the steps S1331 to S1335:

S1331, traversing in sequence from the reference storey to the highest storey, determining whether a current storey is the highest storey when traversing to the current storey; wherein the reference storey comprises a lowest storey;

S1332, determining whether there exists a line segment of the current storey overlapped with a line segment of the reference storey when the current storey is not the highest storey;

S1333, optimizing the line segment of the current storey and the line segment of the reference storey when there exists the line segment of the current storey overlapped with the line segment of the reference storey;

S1334, ceasing the traversing when no any line segment of the current storey overlaps with a line segment of the reference storey; and S1335, ceasing the traversing when the current storey is the highest storey.

According to the present embodiment, the traversing is first performed with the lowest storey as the reference storey. When a number of line segments of the second storey and the lowest storey are the same (e.g., the second storey and the lowest storey has walls with the same shape, size and location), the traversing is continued to the third storey until the current storey does not have any line segment overlapped with the line segment of the reference storey, such that a first traversal is terminated. After completing the optimization of the overlapped line segments, a new traversing is initiated based on the second storey or the current storey as the reference storey, thus repeating the above steps until reaching the highest storey.

Specifically, step S1331 determines whether the current storey is the highest storey first. Since the optimization process of the line segments is performed in the order from the lowest storey to highest the storey, if the current storey is the highest storey, it indicates that the optimization process of the line segments belonging to all the storeys is completed, and no optimization process is required. That is, the method provided by the embodiment is applicable to any storey other than the highest storey.

Specifically, step S1332 determines whether there is a line segment of the current storey overlapped with a line segment of the reference storey by comparing the coordinate data of the endpoints of the line segment of the current storey and the coordinate data of line segments of the reference storey (specifically, comparing the plane coordinate data, that is, the X coordinates and the Y coordinates).

Specifically, in step S1333, if there is a line segments of the current storey overlapped with a line segment of the reference storey, optimize the correspondingly overlapped line segments, and after completing the optimization process for all the correspondingly overlapped line segments, the traversing is continued to the upper storey. If there is no line segment of the current storey overlapped with a line segment of the reference storey, cease the traversing and return to step S1331 to start new traversing and optimizing with a new storey as the reference storey.

Specifically, step S1332 determines that the current storey is not the highest storey, which indicates that the optimization of the line segments is not completed yet. All the line segments belonging to the current storey need to be judged overlapping or not and further the overlapped line segments should be optimized.

Specifically, step S1335 determines that the current storey is the highest storey, which indicates the line segments that need to be optimized have been optimized, that is, the optimization of the line segments that need to be optimized is completed, and then the corresponding optimized binary files are generated.

It should be noted that when traversing to any storey, it is necessary to compare all the line segments of the current storey with all the line segments of the reference line and process the overlapped line segments, and the optimizing must be processed in an order from lower storeys to higher storeys. After optimizing all the overlapped line segments of each storey, an optimized binary file of the architectural objects belonging to the same category is generated for each storey correspondingly.

In another preferred embodiment, optimizing the line segment of the current storey and the line segment of the reference storey comprise:

updating the elevation data of the endpoints of the line segment of the reference storey based on the elevation data of the endpoints of the line segment of the current storey; and deleting the line segment of the current storey.

In another preferred embodiment, updating the elevation data of the endpoints of the line segment of the reference storey based on the elevation data of the endpoints of the line segment of the current storey comprises:

replacing the elevation data of the endpoints of the line segment of the reference storey with the elevation data of the endpoints of the line segment of the current storey.

It can be understood that there may be more than one pair of correspondingly overlapped line segments after the comparison between the line segments belonging to different storeys. A pair of the correspondingly overlapped line segments indicates that the architectural objects corresponding to this pair of line segments are at the same position of different storeys and have a same structure feature, therefore, the modeling processes can be merged. All it has to do is replacing the elevation data of the endpoints of the line segments of the reference story with the elevation data of the endpoints of the line segments of the current storey and deleting the corresponding overlapped line segments of the current storey, therefore after the optimization, all the line segments that are overlapped with each other can be represented by one line segment.

Figure 12A:
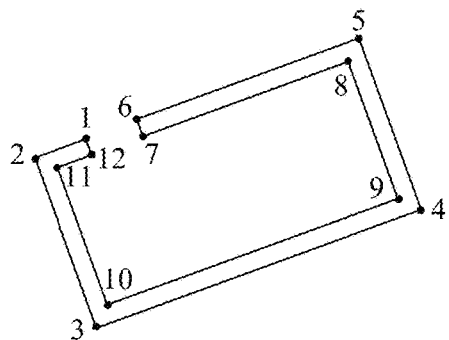
FIG. 12A is a schematic diagram of step S1303 according to a method for automatic modeling of an architecture based on an architectural drawing provided by a preferred embodiment of the present invention.
Figure 12B:
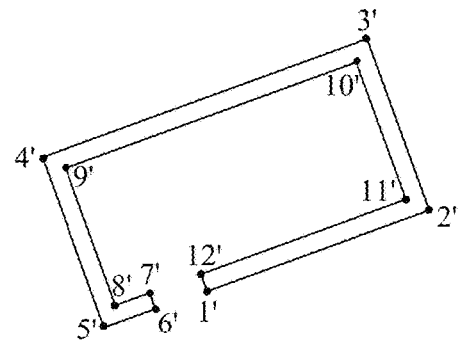
FIG. 12B is a schematic diagram of step S1303 according to a method for automatic modeling of an architecture based on an architectural drawing provided by a preferred embodiment of the present invention.

Referring to FIGS. 12A-12C, which are schematic diagrams of step S1403 according to a method for automatic modeling of an architecture based on an architectural drawing provided by a preferred embodiment of the present invention, FIG. 12A shows walls of the first storey of the architecture, FIG. 12B shows walls at the corresponding position of the second storey of the architecture. By reading the binary file corresponding to the walls of the first storey, acquire that the endpoints constituting the walls are the endpoint 1 to the endpoint 12 respectively, and the corresponding line segments are the line segment 12, the line segment 23, the line segment 34, the line segment 45, the line segment 56, the line segment 67, the line segment 78, the line segment 89, the line segment 910, the line segment 1011, the line segment 1112, and the line segment 121 respectively; by reading the binary file corresponding to the walls of the second storey, acquire that the endpoints constituting the wall are the endpoint 1' to the endpoint 12' respectively, and the corresponding line segments are the line segment 12', the line segment 23', the line segment 34', the line segment 45', the line segment 56', the line segment 67', the line segment 78', the line segment 89', the line segment 910', the line segment 1011', the line segment 1112', and the line segment 121' respectively.

The optimization process in accordance with the embodiments of the present invention will be illustrated with walls of each storey corresponding to a binary file.

When traversing to the second storey from the first storey, determine whether the second storey is the highest storey, and if the second storey is not the highest storey, read the binary file corresponding to the walls of the second storey. Since the second storey is not the highest storey, the coordinate data of the endpoints of all the line segments belonging to the first storey are sequentially compared with the coordinate data of the endpoints of all the line segments belonging to the second storey, and the line segments whose endpoints have the same X coordinate and Y coordinate can be figured out. As shown in FIG. 12A and FIG. 12B, the line segment 23 of the first storey and the line segment 45' of the second storey are overlapped correspondingly, and the line segment 45 of the first storey and the line segment 23' of the second storey are overlapped correspondingly, and the line segment 89 of the first storey and the line segment 1011' of the second storey are overlapped correspondingly, and the line segment 1011 of the first storey and the line segment 89' of the second storey are overlapped correspondingly.

Firstly, modify the binary file of the walls of the first storey. Assign the elevation data of the endpoints of the line segment 45', the line segment 23', the line segment 1011', and the line segment 89' of the second storey to the line segment 23, the line segment 45, the line segment 89 and the line segment 1011 of the first storey correspondingly. Then, modify the binary file corresponding to the walls of the second storey, and delete the endpoints corresponding to the line segment 45', the line segment 23', the line segment 1011', and the line segment 89' of the second storey and endpoint related information thereof in the binary file. After the deletion of the line segments, the walls of the second storey is as shown in FIG. 12C.

And then when traversing to the third storey from the second storey, determine whether the third storey is the highest storey. If the third storey is not the highest storey, read the binary file corresponding to the walls of the third storey and compare it with the binary file corresponding to the wall of the first storey according to the above method, thereby the binary file corresponding to the walls of the first storey and the binary file corresponding to the walls of the third storey are modified correspondingly. In the first traversing, when the binary files corresponding to the walls of all the storeys above the first storey are compared with the binary file corresponding to the walls of the first storey respectively and optimized accordingly. After that, the optimization process of the binary file corresponding to the walls of the first storey is completed, and the optimized binary file corresponding to the walls of the first storey is generated correspondingly.

After the optimization process of the binary file corresponding to the walls of the first storey is completed, start over a second traversing. The second traversing is performed from the second storey to the upper storeys successively. Each time when a current storey is traversed to, compare the binary file corresponding to the walls of the current storey with the binary file corresponding to the walls of the second storey respectively and perform optimizing process accordingly, so as to complete the optimization processing of the binary file corresponding to the walls of the second storey, and the optimized binary file corresponding to the walls of the second storey is generated correspondingly.

By analogy, the optimization process continues until the binary file corresponding to the walls of the below adjacent storey of the highest storey is compared with the walls of the lower storeys and optimized accordingly, then the entire optimization process ends and a corresponding optimized binary file corresponding to the walls is generated for each storey correspondingly.

The above description is only exemplified by the walls of each storey corresponding to a binary file, and the case where the walls of all storeys corresponds to a binary file is also within the protection scope of the present invention, and details will not be described herein.

It should be understood that when optimizing a binary file corresponding to the walls of a certain storey, the binary files corresponding to the walls of the storeys above the certain storey may be modified accordingly. Therefore, when the binary files corresponding to the walls of all the storeys above this storey are optimized respectively in the subsequent process, the binary files will be further processed based on the modified binary files, thereby the number of the line segments that need to be processed in modeling is greatly reduced, and the efficiency of modeling is improved.

Referring to FIG. 13, which is a specific flowchart of step S14 according to a method for automatic modeling of an architecture based on an architectural drawing provided by a preferred embodiment of the present invention, the step of generating a three-dimensional model of the architecture based on the optimized binary files comprises steps S1401 to S1402:

step S1401, generating three-dimensional models of the architectural objects belonging to the same category based on the one or more optimized binary files; and step S1401, generating a three-dimensional model of the architecture based on three-dimensional models of all architectural objects of the architecture.

Specifically, a three-dimensional engine can generate a three-dimensional model of an architectural object according to the corresponding binary file after the binary file is input into the three-dimensional engine. For an entire architecture, the architecture is comprised of different architectural objects. In view of this, three-dimensional models for the architectural objects belonging to the same category are generated by the three-dimensional engine based on the corresponding binary file or the corresponding binary files firstly, and three-dimensional models of all the architectural objects are combined according to the corresponding positions, thus generating the three-dimensional model of the architecture, thereby the three-dimension modeling of the architecture is accomplished.

In another embodiment, the architectural objects belonging to the same category are walls, then generating three-dimensional models for the architectural objects belonging to the same category based on the optimized binary file or the optimized binary files comprises:

reading the one or more optimized binary files to obtain the coordinate data and the corresponding elevation data of all the endpoints in the one or more optimized binary files;

acquiring a pair of endpoints of a line segment, generating a wall based on the pair of endpoints of the line segment and the corresponding coordinate data and the corresponding elevation data of the pair of endpoints; and generating all walls corresponding the one or more optimized binary files.

It can be understood that a binary file stores the relevant information of endpoints. A line segment can be generated based on two endpoints belonging to the same line segment. A wall can be generated based on the elevation data corresponding to the endpoints and the line segments. Similarly, all walls can be generated after all the endpoints belonging to the same line segment are processed, and by combining all the generated walls, a three-dimensional model of the architectural object can be obtained.

In another embodiment, generating the wall based on the pair of endpoints of the line segment and the corresponding coordinate data and the corresponding elevation data of the pair of endpoints comprises:

generating two new endpoints based on the coordinate data and the elevation data of the pair of endpoints of the line segment;

generating two triangles based on the pair of endpoints of the line segment and the two new endpoints; and obtaining the wall by seamlessly splicing the two triangles.

This embodiment is a specific method for generating one wall based on two adjacent endpoints. Referring to FIG. 14 is a schematic diagram illustrating one wall generated based on two endpoints belonging to the same line segment according to a method for automatic modeling of an architecture based on an architectural drawing provided by the present invention. Here, taking a wall as an example, the endpoint A and the endpoint B in the figure are the two endpoints belonging to the same line segment in the binary file corresponding to the walls, the coordinate data and the height for the endpoint A are $(x1, y1, z1)$ and h respectively, the coordinate data and height data for the endpoint B are $(x2, y2, z2)$ and h respectively.

Firstly, generate the line segment AB based on the endpoint A and the endpoint B, and then keep the X coordinates and the Y coordinates of the endpoint A and the endpoint B unchanged and make the Z coordinates plus h, as a result the endpoint C $(x1, y1, z1+h)$ and endpoint D $(x2, y2, z2+h)$ are generated accordingly. And then, based on the endpoint A, the endpoint B, the endpoint C, and the endpoint D, two triangles are generated which are triangle ABC and triangle BCD respectively. The rectangular ABDC is generated by seamlessly splicing the triangle ABC and triangle BCD. The rectangular ABDC is one wall.

Figure 15C:
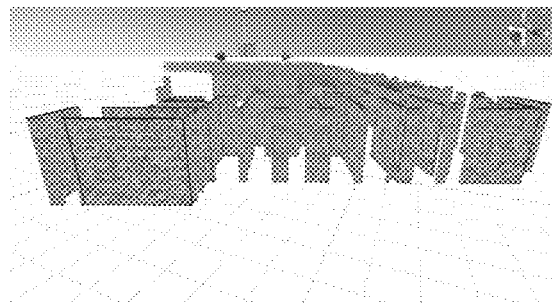
FIG. 15C is a diagram illustrating a three-dimensional model rendering of a wall according to a method for automatic modeling of an architecture based on an architectural drawing provided by the present invention.
Figure 15D:
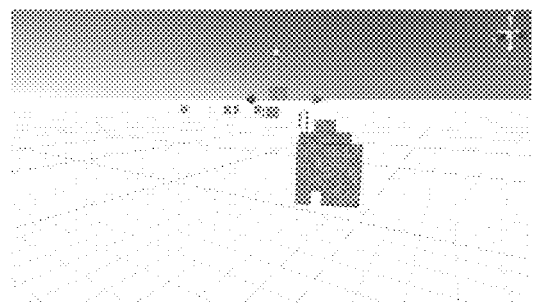
FIG. 15D is a diagram illustrating a three-dimensional model rendering of a wall according to a method for automatic modeling of an architecture based on an architectural drawing provided by the present invention.

Referring to FIGS. 15A-15D, which are diagrams illustrating a three-dimensional model rendering of a wall according to a method for automatic modeling of an architecture based on an architectural drawing provided by the present invention. Wherein, FIG. 15A is a partial view of the three-dimensional model of the wall of the first storey before optimization, FIG. 15B is a partial view of the three-dimensional model of the wall of the first storey after optimization, FIG. 15C is a partial view of the three-dimensional model of the walls of the second storey before optimization, and FIG. 15D is a partial view of the three-dimensional model of the wall of the second storey after optimization. As can be seen from the figure, one wall can be generated accordingly by constructing triangles and splicing into rectangles, and the three-dimensional model of the architecture can be obtained by combining all walls. By comparing FIG. 15A and FIG. 15B, it is known that the heights of the walls generated based on the one or more optimized binary files have changed. By comparing FIG. 15C and FIG. 15D, it is known that the number of wall generated based on the optimized binary file is greatly reduced.

Figure 16:
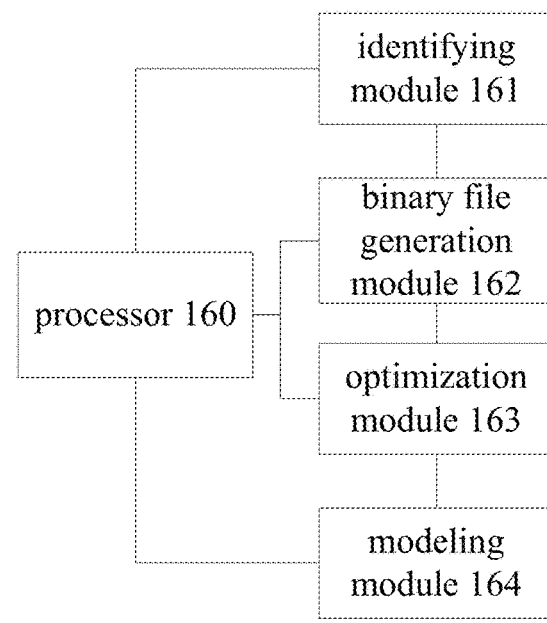
FIG. 16 is a flowchart of an apparatus for automatic modeling of an architecture based on an architectural drawing provided by a preferred embodiment of the present invention.

With reference to FIG. 16, which is a schematic view of an apparatus for automatic modeling of an architecture based on an architectural drawing, the apparatus comprises a processor 160 and the processor is configured to execute the following program modules:

an identifying module 161, configured to read parameter information of the architectural drawing, identifying a category of an architectural object by acquiring line segments constituting the architectural object and coordinate data of endpoints of the line segments;

a binary file generation module 162, configured to generate one or more binary files of the architectural objects belonging to a same category of all story of the architectural drawing based on the coordinate data and elevation data of the endpoints of all the line segments of the architectural objects;

an optimization module 163, configured to optimize said one or more binary files of the architectural objects belonging to the same category for all the storeys of the architectural drawing to obtain one or more optimized binary files; and a modeling module 164, configured to generate a three-dimensional model of the architecture based on the optimized binary files.

Figure 17:
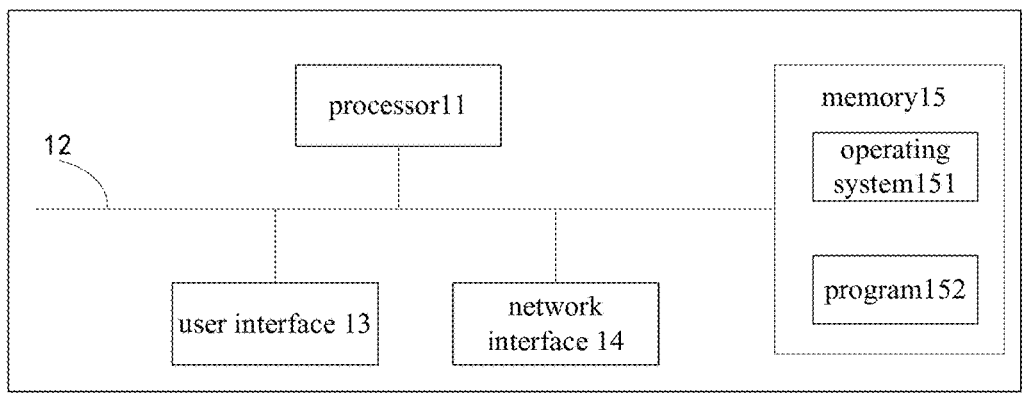
FIG. 17 is a flowchart of an apparatus for automatic modeling of an architecture based on an architectural drawing provided by a preferred embodiment of the present invention.

With reference to FIG. 17, which is a schematic view of an apparatus for automatic modeling of an architecture based on an architectural drawing, the apparatus for automatic modeling of an architecture based on an architectural drawing includes: at least one processor 11, such as CPU, at least one network interface 14 or other user interfaces 13, memory 15, at least one communication bus 12, which enables the communication link between these modules. Alternatively, the user interface 13 may include a USB interface or other standard interfaces and cable interfaces. The network interface 14 may optionally include a WI-FI interface or other wireless interfaces. Memory 15 may include a high-speed RAM memory, or may also comprise a non-volatile memory, such as at least one magnetic disk storage. Optionally, memory 15 may contain at least one storage device remote from the processor 11.

In some embodiments, memory 15 may store the following elements, such as executable module, data structure, or their subsets and extended sets:

Operating system 151, comprises various system programs and is being used to provide basic services and process hardware-based tasks;

Program 152.

Specifically, processor 11 is used to call the program 152 stored in the memory 15, and perform the methods for automatic modeling of an architecture based on an architectural drawing in accordance with the abovementioned embodiments.

In some exemplary embodiments of the present invention, the computer program can be divided into one or more modules/elements, the one or more modules/elements, which are stored in the memory, are executed by the processor to complete the methods in the present disclosure.

The one or more modules/elements may be a series of computer program instruction segments which are capable of carrying out a particular function, the instruction segments can be used to describe the execution process of the computer program in the apparatus for automatic modeling of an architecture based on an architectural drawing.

The apparatus for automatic modeling of an architecture based on an architectural drawing may be computing devices such as desktop computers, notebooks, palmtops or cloud servers. The apparatus for automatic modeling of an architecture based on an architectural drawing may include, but is not limited to, a processor, a memory. A person skilled in the art may understand that the schematic diagram is merely an example of the apparatus for automatic modeling of an architecture based on an architectural drawing, does not limit the scope of the apparatus for automatic modeling of an architecture based on an architectural drawing, and the apparatus may include more components or fewer components than those in the figure, some components may be combined, or different component may be used.

The processor 11 may be a Central Processing Unit (CPU), or may also be other general-purpose processors, a digital Signal Processor (DSP), a application Specific Integrated Circuit (ASIC), a field-Programmable Gate Array (FPGA), or other programmable logic devices, a discrete gate or a transistor logic device, a discreted hardware component, or the like. The general-purpose processor may be a microprocessor, or may also be any other general processors or the like. The processor 11, which can connect different parts of the whole apparatus for quickly realize automatic modeling of an architecture based on an architectural drawing together by various interfaces and lines, is the control center of the apparatus for automatic modeling of an architecture based on an architectural drawing.

The memory 15 may be configured to store the computer program and/or module, the processor 11 achieves various functions of the apparatus for automatic modeling of an architecture based on an architectural drawing by running or executing the computer program and/or module stored in the memory, and by calling the data stored in the memory. The memory 15 may mainly include program area and data area, wherein the program area may store an operating system, an application program required for at least one function (such as a sound playback function, an image playback function, etc), and the like. The data area may store the data created according to the use of mobile phone (such as audio data, telephone book, etc). In addition, memory 15 may include high-speed random-access memory, or may also include nonvolatile memory, such as a hard disk, a memory, a pluggable hard disk, a smart media card (SMC), a secure digital card (SD card), a flash card, at least one disk storage device, a flash memory, or other volatile solid-state memory devices.

Wherein, the modules/elements that are integrated by the apparatus for automatic modeling of an architecture based on an architectural drawing can be stored in the readable storage medium of a computer if they are implemented in the form of software function unit and sold or used as an independent product. From this point of view, all or parts of the steps of the method in abovementioned embodiments of present invention may also be performed with the related hardware instructed by the computer programs. The computer programs can be stored in a computer-readable storage medium, and steps of the methods in above mentioned embodiments can be realized when the computer program is executed by the processor. Thereinto, the computer program comprises computer program code; the computer program code may be in source code forms, object code forms, executable files or other intermediate forms, etc. The computer readable medium may include: any entities or devices capable of carrying the computer program code, a recording medium, a USB flash disk, a mobile hard disk, a magnetic disk, a light disk, a computer storage, a read-only memory (ROM), a random access memory (RAM) or a software distribution medium, etc. It should be noted that the information contained in the computer readable medium may be properly increased or decreased according to the requirements of the legislation and the patent practice in a jurisdiction.

Above all, in the method for automatic modeling of an architecture based on an architectural drawing provided by the embodiments of the present invention, the location, size, type, and spatial geometry of architectural objects such as columns, walls, doors, windows, staircases, balconies, ventilation shafts, floors, and roofs can be identified by utilizing the information of the architectural objects with respect to the corresponding layer and the connection relationship between architectural objects, and the three-dimension model of the architecture can be automatically generated by inputting the binary files corresponding to each type of architectural objects into the three-dimension engine, so that the outline and structure of the architecture can be expressed accurately, and the modeling accuracy can be improved. In addition, after identifying the architectural objects of each storey of the multi-storey architecture storey by storey, by comparing the similarities and differences between the same type of architectural objects of different storeys, optimizing the binary file or the binary files corresponding to the architectural objects belonging to the same category for all the storeys of the architectural drawing, and merging the line segments with the same features, the amount of data that need to be processed in three-dimension modeling can be reduced, and the modeling efficiency can be improved.

The above-mentioned embodiments are the preferred embodiments of the present invention. It should be noted that those skilled in the art can make various improvements and modifications without departing from the technical principles of the present invention, such improvements and modifications should also be considered as the protection scope of the present invention.

What is claimed is:

1. A method for automatic modeling of an architecture based on an architectural drawing, wherein the method comprises steps of:

reading parameter information of the architectural drawing, identifying a category of an architectural object by acquiring line segments constituting the architectural object and coordinate data of endpoints of the line segments;

generating one or more binary files of the architectural objects belonging to a same category of all storeys of the architectural drawing based on the coordinate data and elevation data of the endpoints of all the line segments of the architectural objects;

optimizing said one or more binary files of the architectural objects belonging to the same category for all the storeys of the architectural drawing to obtain one or more optimized binary files; and generating a three-dimensional model of the architecture based on the optimized binary files;

the step of optimizing said one or more binary files of the architectural objects belonging to the same category for all the storeys of the architectural drawing to obtain one or more optimized binary files comprises:

reading said one or more binary files of the architectural objects belonging to the same category for all the storeys of the architectural drawing to obtain the coordinate data and the elevation data of the endpoints of all the line segments of the architectural objects;

obtaining all the line segments constituting the architectural objects based on the obtained coordinate data and the elevation data of the endpoints of the line segments;

traversing in sequence from a reference storey to a highest storey, determining whether a current storey is the highest storey when traversing to the current storey; wherein the reference storey comprises a lowest storey;

determining whether there exists a line segment of the current storey overlapped with a line segment of the reference storey when the current storey is not the highest storey;

optimizing the line segment of the current storey and the line segment of the reference storey when there exists the line segment of the current storey overlapped with the line segment of the reference storey;

ceasing the traversing when there is no line segment of the current storey overlaps with a line segment of the reference storey; and ceasing the traversing when the current storey is the highest storey.

2. The method of claim 1, wherein the category of the architectural object of the architectural drawing comprises a column, a wall, a door, a window, a staircase, a balcony, a ventilation shaft, a floor, and a roof;

wherein identifying a category of an architectural object by acquiring line segments constituting the architectural object and coordinate data of endpoints of the line segments comprises:

setting an identifying order of priority of each kind of the category; and on the basis of the identifying order, finding out the line segments constituting the architectural object of the category and the coordinate data of the endpoints of the line segments to identify the category of the architectural object.

3. The method of claim 1, wherein optimizing the line segment of the current storey and the line segment of the reference storey comprises:

updating the elevation data of the endpoints of the line segment of the reference storey based on the elevation data of the endpoints of the line segment of the current storey; and deleting the line segment of the current storey.

4. The method of claim 3, wherein updating the elevation data of the endpoints of the line segment of the reference storey based on the elevation data of the endpoints of the line segment of the current storey comprises:

replacing the elevation data of the endpoints of the line segment of the reference storey with the elevation data of the endpoints of the line segment of the current storey.

5. The method of claim 1, wherein the step of generating a three-dimensional model of the architecture based on the optimized binary files comprises:

generating three-dimensional models of the architectural objects belonging to the same category based on the one or more optimized binary files; and generating a three-dimensional model of the architecture based on three-dimensional models of all architectural objects of the architecture.

6. The method of claim 5, wherein the architectural objects belonging to the same category are walls, then generating three-dimensional models of the architectural objects belonging to the same category based on the one or more optimized binary files comprises:

reading the one or more optimized binary files to obtain the coordinate data and the corresponding elevation data of all the endpoints in the one or more optimized binary files;

acquiring a pair of endpoints of a line segment, generating a wall based on the pair of endpoints of the line segment and the corresponding coordinate data and the corresponding elevation data of the pair of endpoints; and generating all walls corresponding the one or more optimized binary files.

7. The method of claim 6, wherein generating a wall based on the pair of endpoints of the line segment and the corresponding coordinate data and the corresponding elevation data of the pair of endpoints comprises:

generating two new endpoints based on the coordinate data and the elevation data of the pair of endpoints of the line segment;

generating two triangles based on the pair of endpoints of the line segment and the two new endpoints; and obtaining the wall by seamlessly splicing the two triangles.

8. An apparatus for automatic modeling of an architecture based on an architectural drawing, wherein the apparatus comprises a processor, a memory, and a computer program stored in the memory and configured to be executed by the processor, the processor executing the computer program to implement the method of for automatic modeling of an architecture based on an architectural drawing according to claim 1.

9. An apparatus for automatic modeling of an architecture based on an architectural drawing, the apparatus comprising a processor, wherein the processor is configured to execute the following program modules:

an identifying module, configured to read parameter information of the architectural drawing, identifying a category of an architectural object by acquiring line segments constituting the architectural object and coordinate data of endpoints of the line segments;

a binary file generation module, configured to generate one or more binary files of the architectural objects belonging to a same category of all storeys of the architectural drawing based on the coordinate data and elevation data of the endpoints of all the line segments of the architectural objects;

an optimization module, configured to optimize said one or more binary files of the architectural objects belonging to the same category for all the storeys of the architectural drawing to obtain one or more optimized binary files; and a modeling module, configured to generate a three-dimensional model of the architecture based on the optimized binary files;

wherein the optimization module, when optimizing said one or more binary files of the architectural objects belonging to the same category for all the storeys of the architectural drawing to obtain one or more optimized binary files, is configured to:

read said one or more binary files of the architectural objects belonging to the same category for all the storeys of the architectural drawing to obtain the coordinate data and the elevation data of the endpoints of all the line segments of the architectural objects;

obtain all the line segments constituting the architectural objects based on the obtained coordinate data and the elevation data of the endpoints of the line segments;

traverse in sequence from a reference storey to a highest storey, determining whether a current storey is the highest storey when traversing to the current storey; wherein the reference storey comprises a lowest storey;

determine whether there exists a line segment of the current storey overlapped with a line segment of the reference storey when the current storey is not the highest storey;

optimize the line segment of the current storey and the line segment of the reference storey when there exists the line segment of the current storey overlapped with the line segment of the reference storey;

cease the traversing when there is no line segment of the current storey overlaps with a line segment of the reference storey; and cease the traversing when the current storey is the highest storey.

* * * * *